(12) United States Patent
Flaherty

(10) Patent No.: US 7,016,802 B2
(45) Date of Patent: Mar. 21, 2006

(54) PHOTOCONTROL DEVICES HAVING FLEXIBLE MOUNTED PHOTOSENSORS AND METHODS OF CALIBRATING THE SAME

(75) Inventor: Richard Charles Flaherty, Fuquay Varina, NC (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/656,431

(22) Filed: Sep. 5, 2003

(65) Prior Publication Data

US 2005/0055172 A1   Mar. 10, 2005

(51) Int. Cl.
*G01R 31/00* (2006.01)
*G01R 31/14* (2006.01)

(52) U.S. Cl. ..................................... 702/117
(58) Field of Classification Search .............. 702/40, 702/85, 94, 104, 150–154, 116, 117
See application file for complete search history.

(56) References Cited

U.S. PATENT DOCUMENTS

| | | | |
|---|---|---|---|
| 2,978,591 A | 4/1961 | Ringger, Jr. | 250/239 |
| 3,379,892 A | 4/1968 | Neagle | 250/237 |
| 4,774,613 A * | 9/1988 | Okita et al. | 360/99.07 |

FOREIGN PATENT DOCUMENTS

| | | |
|---|---|---|
| DE | 12 83 331 B | 11/1968 |
| EP | 0 398 088 A | 11/1990 |
| JP | 4069527 | 3/1992 |

OTHER PUBLICATIONS

"Ready Reference Guide, Photo controls and Light Products", http://energy_tycoelectronics.com/rrg/alr_rrg/mainindx_pdf, Copyright 2001, Tyco Electronics.
PCT International Search Report and Written Opinion of the International Searching Authority, PCT/US2004/026545, mailed Nov. 25, 2004.

* cited by examiner

Primary Examiner—Michael Nghiem
(74) Attorney, Agent, or Firm—Myers Bigel Sibley & Sajovec, PA

(57) ABSTRACT

Methods for calibrating a photocontrol device having at least one flexible mounting leg mounting the photosensor to a circuit board and being electrically coupled to activate a switching device and calibrated photocontrol devices are provided. A photocontrol device is positioned proximate a light source. An aperture is positioned between the photosensor and the light source and an angle between the at least one flexible mounting leg and the circuit board is adjusted to calibrate a sensitivity of the photocontrol device to light from the light source passing through the aperture.

10 Claims, 4 Drawing Sheets

PHOTOCONTROL DEVICES HAVING FLEXIBLE MOUNTED PHOTOSENSORS AND METHODS OF CALIBRATING THE SAME

BACKGROUND OF THE INVENTION

The present invention relates to control devices and, more particularly, to photocontrol devices and methods of calibrating the same.

Photocontrol devices are used in a variety of applications where it is desirable to provide a control signal responsive to detection of a light level. One common application of such photocontrol devices is in the detection of ambient light levels. In particular, to detect that transition from daylight to night so that lights may be turned on for security, safety and/or aesthetic reasons. For example, street lights are generally provided with photocontrol devices to turn on the street lights at dusk. An example of such a photocontrol device is the Model 2000 series of photocontrols available from Tyco Electronics Corporation.

Because of the variability typically found in sensing devices such as photocontrol devices, they are generally calibrated before and/or after installation. Such calibration typically includes adjusting the sensitivity of a photosensor circuit included in the photocontrol device so that it activates a switch at a desired light level. The switch may be, for example, a relay in the photocontrol device that provides power to turn on a light when the detected light level drops below a selected level. Known approaches to adjusting the sensitivity of the photocontrol device to calibrate the photocontrol device include changing a calibration resistor coupled to the photosensor, providing a rotary mounted photosensor and/or changing the size of an aperture/window of the photocontrol device through which the photosensor receives light. Each of these approaches may increase the cost of the photosensor device and/or the difficulty of the calibration process.

SUMMARY OF THE INVENTION

Embodiments of the present invention provide methods for calibrating a photocontrol device having at least one flexible mounting leg mounting a photosensor to a circuit board and being electrically coupled to activate a switching device and calibrated photocontrol devices. A photocontrol device is positioned proximate a light source. An aperture is positioned between the photosensor and the light source and an angle between the at least one flexible mounting leg and the circuit board is adjusted to calibrate a sensitivity of the photocontrol device to light from the light source passing through the aperture.

In other embodiments of the present invention, adjusting an angle includes bending the at least one flexible mounting leg. The at least one flexible mounting leg may be a first and second wire lead coupling the photosensor to a relay circuit of the photocontrol device. The first and second wire lead may be copper.

In further embodiments of the present invention, adjusting an angle includes adjusting a magnitude of misalignment between the photosensor and the aperture to calibrate the sensitivity of the photocontrol device. The magnitude of misalignment may be increased to decrease the sensitivity of the photocontrol device.

In other embodiments of the present invention, the photocontrol device is configured for mounting with the photosensor on an upper surface of the circuit board. A cover is positioned over the upper surface of the circuit board and the cover includes a light transmissive window therein defining the aperture. The magnitude of misalignment is adjusted by bending the at least one flexible mounting leg to increase an angle between the photosensor and the circuit board facing the aperture to reduce the sensitivity of the photocontrol device.

In further embodiments of the present invention, the cover includes a tool access opening on a top thereof. Positioning an aperture between the photosensor and the light source includes placing the cover over the upper surface of the circuit board. The magnitude of misalignment is adjusted by inserting an adjusting tool in the opening to contact the photosensor and moving the photosensor with the adjusting tool until a desired sensitivity is obtained. The light level of the light source may also be adjusted to a calibration level and the photosensor may be moved until a relay coupled to the photosensor changes state.

In other embodiments of the present invention, methods for calibrating a photocontrol device including a photosensor positioned to receive light from an aperture are provided. A flexible mounting leg of the photosensor is bent to a selected misalignment relative to the aperture to provide a desired sensitivity of the photocontrol device to light from the aperture.

In further embodiments of the present invention, calibrated photocontrol devices include a circuit board having a photosensor mounted on an upper surface thereof. A cover having a light transmissive window therein is positioned over the upper surface of the circuit board with the light transmissive window positioned adjacent the photosensor. The photosensor is mounted on the circuit board by at least one flexible mounting leg that is bent to a selected angle to misalign the photosensor and the light transmissive window to provide a desired sensitivity to light of the photocontrol device.

In other embodiments of the present invention, a detection circuit is coupled to the photosensor by the at least one flexible mounting leg and the detection circuit electrically couples the photosensor to a detection element of the detection circuit without a calibration resistor therebetween. The detection element may be a comparator. The photosensor may be misaligned toward an upper surface of the cover and away from the circuit board and the cover may be configured to present a shadowed region to the photosensor when the photocontrol device is positioned in sunlight.

DETAILED DESCRIPTION

Figure 1:
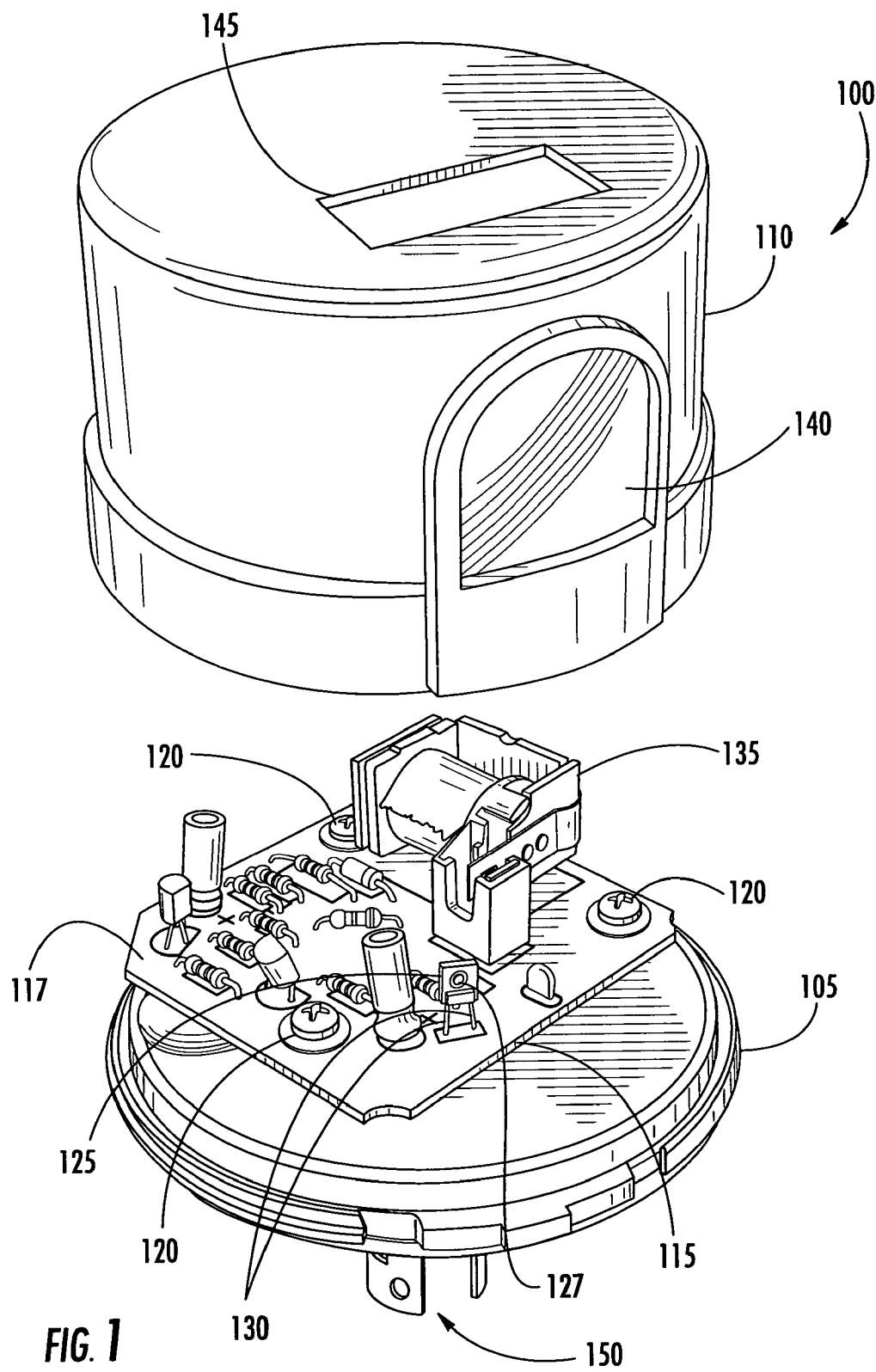
FIG. 1 is an exploded perspective view of a photocontrol device according to some embodiments of the present invention.

The present invention now will be described more fully hereinafter with reference to the accompanying drawings, in which illustrative embodiments of the invention are shown. In the drawings, the relative sizes of regions or features may be exaggerated for clarity. In the drawings, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout. This invention may be embodied in many different forms and should not be construed as limited to the embodiments set forth herein; rather, these embodiments are provided so that this disclosure will be thorough and complete, and will fully convey the scope of the invention to those skilled in the art.

Embodiments of the present invention will now be described with reference to the various embodiments illustrated in FIGS. 1 to 3. FIG. 1 is an exploded perspective view of a photocontrol device 100 according to some embodiments of the present invention. As shown in the embodiments of FIG. 1, the photocontrol device 100 includes a base 105 and a mating cover 110 that together define an enclosure for a circuit board 115.

The circuit board 115, as illustrated in FIG. 1, is connected to the base 105 by mounting screws 120. The circuit board 115 also includes, on an upper surface 117 thereof, a photosensor 125 coupled to the upper surface 117 of the circuit board 115 by two flexible mounting legs 130. While shown with two mounting legs 130, it will be understood that more or less flexible mounting legs may be provided according to various embodiments of the present invention. In the illustrated embodiment of FIG. 1, the flexible mounting legs 130 may be first and second wire leads that also electrically couple the photosensor 125 to a detection circuit of the photocontrol device 100, generally illustrated by the various other electrical components shown on the circuit board 115, and to the switching device 135. The switching device 135 is illustrated as a relay in FIG. 1. The photocontrol device circuitry of FIG. 1 is configured so that the detection of light by the photosensor 125 activates or deactivates the relay 135. The relay 135 may, in turn, be coupled through the electrical connector 150 to an associated light source that may be turned on or off responsive to the state of the relay 135.

As further shown in FIG. 1, the cover 110 includes a light transmissive aperture (opening) or window 140 that allows ambient light to reach the photosensor 125. The light transmissive window 140 is positioned adjacent the photosensor 125 when the cover 110 is positioned over the upper surface 117 of the circuit board 115 on the base 105. The flexible mounting legs 130 are bent to a selected angle to misalign the photosensor 125 and the light transmissive window 140 to provide a desired sensitivity to light of the photocontrol device 100.

It will be understood by those of skill in the art that various conventional detection elements may be used to couple the photosensor 125 to the relay 135. For example, a comparator may be provided as a detection element in the detection circuit. The comparator may be an analog comparator having a reference voltage and/or may be a digital circuit having a programmable reference level.

Also shown in the cover 110 of FIG. 1 is a tool access opening 145 on a top or upper wall thereof. As will be described further herein, the tool access opening 145 may be used in adjusting the sensitivity of the photocontrol device 100 in accordance with various embodiments of the present invention. However, it will also be understood that the opening 145 may not be provided in the photocontrol device 100 as sold and may merely be provided as part of a test fixture used during calibration of the photocontrol device 100. Alternatively, the opening 145 may be covered or otherwised closed before shipping of the photocontrol device 100.

It will be understood that the alignment or more particularly, the misalignment, of the photosensor 125, as that term is used herein, refers to the alignment of the sensing surface or eye 127 of the photosensor 125 relative to the light transmissive window 140 or other aperture that may be provided for use with calibration methods as will be described for various embodiments of the present invention herein. Photosensors and related detection circuits and relays suitable for use with the present invention, such as photosensors including copper component mounting leads are known to those of skill in the art and will not be described further herein.

Figure 2A:
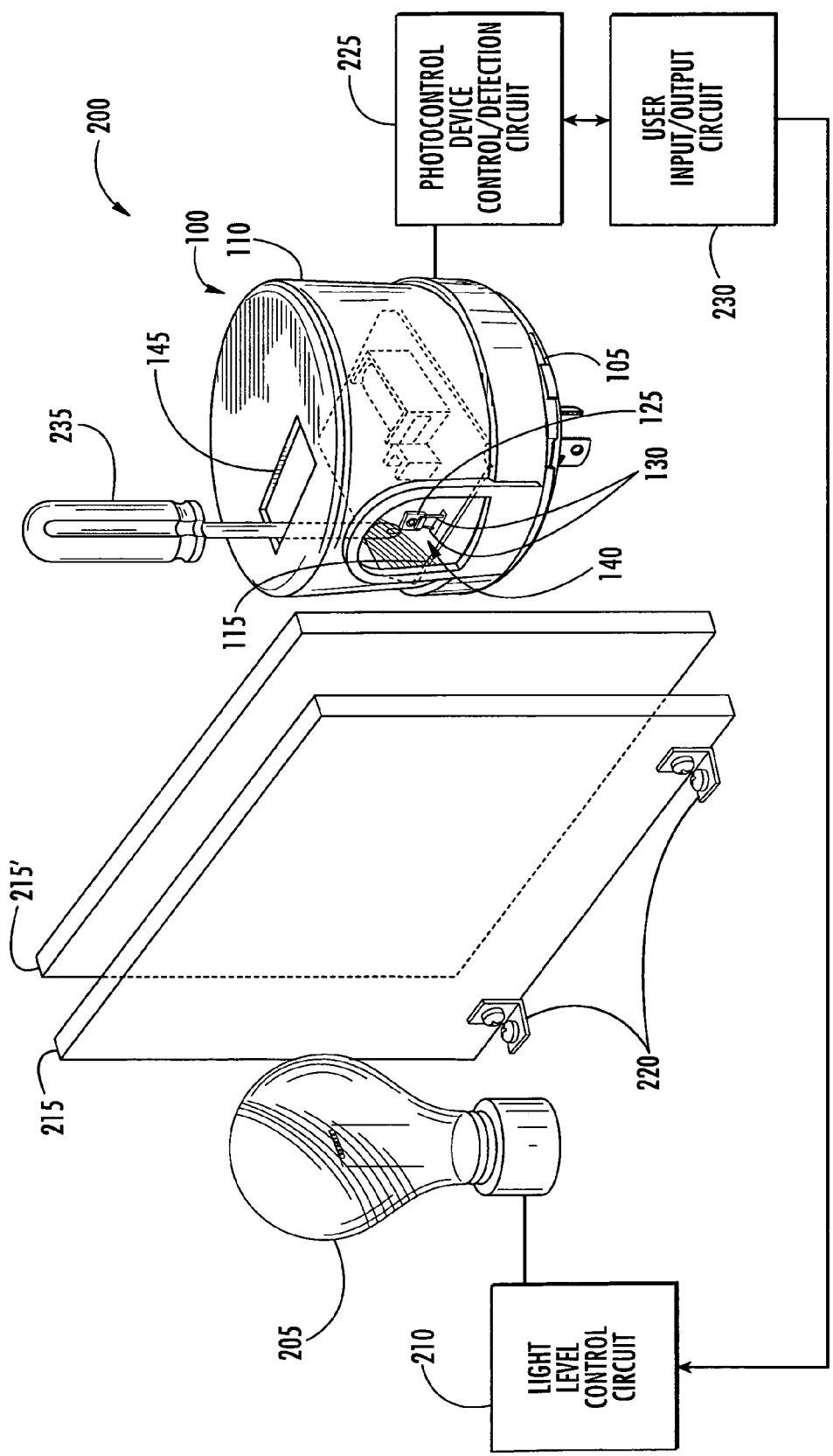
FIGS. 2A–2B are perspective views illustrating calibration of the photocontrol device of FIG. 1 according to some embodiments of the present invention.
Figure 2B:
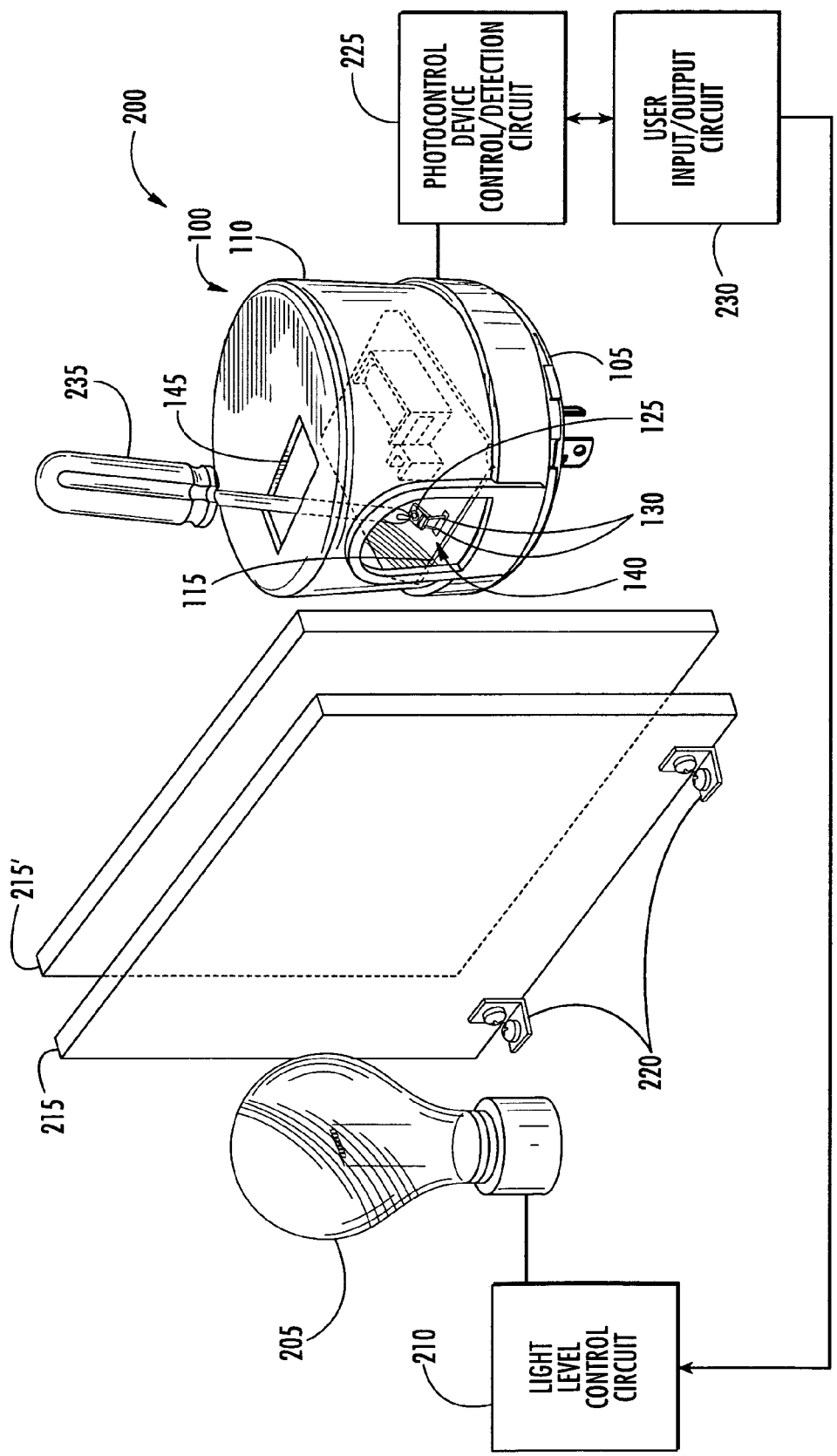

Operations related to calibration of a photocontrol device according to various embodiments of the present invention will now be further described with reference to the calibration/test apparatus schematically illustrated in FIGS. 2A and 2B. As shown in FIGS. 2A and 2B, the photocontrol device 100 is positioned proximate a light source 205. A pair of light diffusion plates 215, 215' are positioned between the light source 205 and the photocontrol device 100. The light diffusion plates 215, 215' are shown as mounted in a parallel relationship by mounting brackets 220. The light transmissive window 140 is shown positioned between the photosensor 125 and the light source 205 to define an aperture between the light source 205 and the photosensor 125.

The light source 205 is coupled to a light level control circuit 210 and the photocontrol device 100 is coupled to a photocontrol device control/detection circuit 225. A user input/output circuit 230 as operatively connected to the light level control circuit 210 and photocontrol device control/detection circuit 225. The user input/output circuit 230 is operative to send signals to the light level control circuit 210 to adjust the light level of the light source 205 to a desired calibration level for use in calibrating the photocontrol device 100. The user input/output circuit 230 is further configured to provide inputs to the photocontrol device control/detection circuit setting reference voltage levels and the like for establishing a switching level for the relay 135 and further to detect activation or deactivation of the relay 135.

FIGS. 2A and 2B illustrate embodiments of the present invention in which an adjusting tool, such as the screw driver 235, is used to move the photosensor 125 to provide a desired sensitivity for the photocontrol device 100. As shown in FIG. 2A, the photosensor 125 extends generally transversely from the upper surface 117 of the circuit board 115 with the legs 130 and the photosensor 125 running in a plane generally parallel to a plane defined by the light transmissive window 140 and substantially in alignment with the window 140. As shown in FIG. 2B, the legs 130 have been bent, by moving the screwdriver 235 in the opening 145, to a misalignment angle of approximately 30°. In particular, in FIG. 2B, the photosensor 125 is misaligned toward an upper surface of the cover 110 and away from the circuit board 115. In other words, the eye 127 is pointed away from the upper surface 117 of the circuit board 115. Such a direction of misalignment may be desirable where the cover 110 is configured to present a shadowed region to the photosensor 125 when the photocontrol device 100 is positioned in sunlight. Such an adjustment orientation towards an upper surface of the cover 110 may provide more uniform detection of light levels in use by reducing the potential for variability in reflection effects from the circuit board 115 and/or ground cover in the area where the photocontrol device 100 is mounted in use causing variability in the switching characteristics of a control device 100.

It will be understood that a variety of different light sources, including light emitting diodes and the like, may be used as the light source 205. It will further be understood that a light diffusion plate 215, 215' are merely illustrative of one approach to providing controlled lighting for test purposes and other approaches may be used in various embodiments of the present invention. Furthermore, both FIGS. 2A and 2B illustrate using the light transmissive window 140 in the cover 110 as the aperture between the light source 205 and the photosensor 125. It will be understood that any suitable test aperture positioned between the photosensor 125 and the light source 205 may be used in various embodiments of the present invention.

Operations for calibrating a photocontrol device according to various embodiments of the present invention will now be described with reference to the flowchart illustration of FIG. 3. The present invention provides methods for calibrating a photocontrol device including a photosensor positioned to receive light from an aperture by bending a flexible mounting leg of the photosensor to a selected misalignment relative to the aperture to provide a desired sensitivity of the photocontrol device to light from the aperture.

Figure 3:
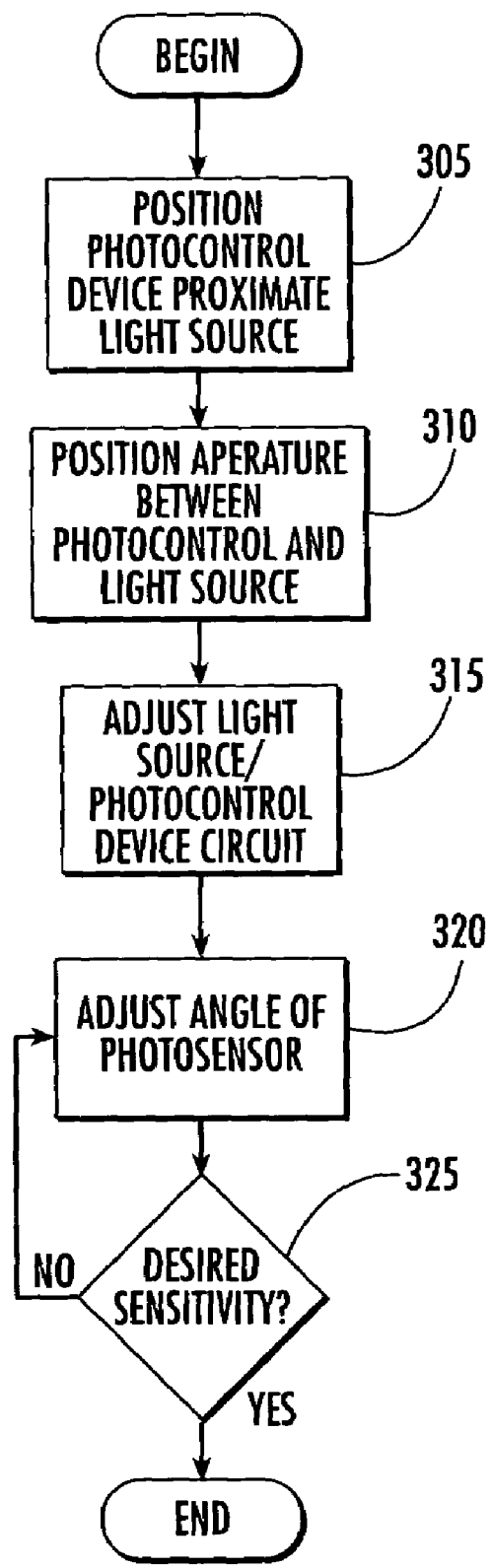
FIG. 3 is a flowchart illustrating operations for calibrating a photocontrol device according to some embodiments of the present invention.

For embodiments of the present invention as illustrated in FIG. 3, operations begin at Block 305 by positioning the photocontrol device 100 proximate a light source 205. An aperture, such as the light transmissive window 140, is positioned between the photosensor 125 and the light source 205 (Block 310).

In some embodiments of the present invention the light source 205 may have its light level adjusted, for example, using the light level control circuit 210, to a calibration level for testing. The photocontrol device control/detector circuit 225 may also adjust reference voltages and the like for the photocontrol device 100 to set test conditions for use during calibration at Block 315. An angle between the mounting leg(s) 130 of the photosensor 125 and the circuit board 115 is adjusted to calibrate a sensitivity of the photocontrol device 100 to light from the light source 205 passing through the aperture 140 (Block 320). Adjustment operations continue until a desired sensitivity is obtained (Block 325).

As discussed with reference to FIGS. 2A and 2B, operations at Block 320 may provide adjusting a magnitude of misalignment between the photosensor 125 and the aperture 140 by inserting an adjusting tool 235 in opening 145 to contact the photosensor 125 and moving the photosensor 125 with the adjusting tool 235 until a desired sensitivity is obtained. The detection of the desired sensitivity has been reached may be provided by moving the photosensor 125 until a relay 130 coupled to the photosensor changes state as detected through the photocontrol device control/detection circuit 225 and the user input/output circuit 230.

As described with reference to various embodiments of the present invention above, bending flexible mounting members such as wire leads of a photosensor to provide a desired sensitivity to the photocontrol device may eliminate the need for sliding shutters, variable resistors and the like associated with known methods of calibrating photocontrol devices. In particular embodiments where the photosensor is mounted by the wire leads already provided conventionally with certain photosensor devices, there may be no need for any additional components or materials as the wire leads are already in use and required for mounting such photosensors so no additional costs or change from a conventional photosensor of such type may be required. Benefits may be provided both from elimination of costly components, such as sliding shutters or variable resistors, and may further provide benefits by reducing the need for maintaining inventory, such as inventory required to provide a range of varied calibration resistors, soldering posts for mounting such resistors in the photocontrol device, and may also eliminate operations, such as a welding operation used to mount selected calibration resistors used for adjusting photosensitivity in various conventional approaches. In some embodiments of the present invention, the resulting light calibration may also provide improved control over sensitivity.

The flowchart of FIG. 3 illustrates the architecture, functionality, and operation of possible implementations of methods for calibrating a photocontrol device according to some embodiments of the present invention. It should be noted that, in some alternative implementations, the acts noted in the blocks may occur out of the order noted in the figures. For example, two blocks shown in succession may, in fact, be executed substantially concurrently, or the blocks may be executed in the reverse order, depending upon the functionality involved.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method for calibrating a photocontrol device having at least one flexible mounting leg mounting the photosensor to a circuit board and being electrically coupled to activate a switching device, the method comprising:

positioning the photocontrol device proximate a light source;

positioning an aperture between the photosensor and the light source; and adjusting an angle between the at least one flexible mounting leg and the circuit board by bending the at least one flexible mounting leg to calibrate a sensitivity of the photocontrol device to light from the light source passing through the aperture;

wherein the at least one flexible mounting leg comprises a first and second wire lead electrically coupling the photosensor to the switching device.

2. The method of claim 1 wherein adjusting an angle comprises adjusting a magnitude of misalignment between the photosensor and the aperture to calibrate the sensitivity of the photocontrol device.

3. A method for calibrating a photocontrol device having at least one flexible mounting leg mounting the photosensor to a circuit board and being electrically coupled to activate a switching device, the method comprising:

positioning the photocontrol device proximate a light source;

positioning an aperture between the photosensor and the light source; and adjusting an angle between the at least one flexible mounting leg and the circuit board to calibrate a sensitivity of the photocontrol device to light from the light source passing through the aperture;

wherein adjusting an angle comprises adjusting a magnitude of misalignment between the photosensor and the aperture to calibrate the sensitivity of the photocontrol device including increasing the magnitude of misalignment to decrease the sensitivity of the photocontrol device.

4. The method of claim 3 wherein the at least one flexible mounting leg comprises a first and second wire lead coupling the photosensor to a relay circuit of the photocontrol device.

5. The method of claim 4 wherein the first and second wire lead comprise copper.

6. A method for calibrating a photocontrol device having at least one flexible mounting leg mounting the photosensor to a circuit board and being electrically coupled to activate a switching device, the method comprising:

positioning the photocontrol device proximate a light source;

positioning an aperture between the photosensor and the light source; and adjusting an angle between the at least one flexible mounting leg and the circuit board to calibrate a sensitivity of the photocontrol device to light from the light source passing through the aperture;

wherein the photocontrol device is configured for mounting the photosensor on an upper surface of the circuit board and further comprises a cover positioned over the upper surface of the circuit board and including a light transmissive window therein defining the aperture and wherein adjusting an angle comprises bending the at least one flexible mounting leg to increase an angle between the photosensor and the circuit board facing the aperture to reduce the sensitivity of the photocontrol device.

7. The method of claim 6 wherein the cover includes a tool access opening on a top thereof and wherein positioning an aperture between the photosensor and the light source comprises placing the cover over the upper surface of the circuit board and wherein adjusting a magnitude of misalignment comprises:

inserting an adjusting tool in the opening to contact the photosensor; and moving the photosensor with the adjusting tool until a desired sensitivity is obtained.

8. The method of claim 7 wherein positioning the photocontrol device proximate a light source further comprises adjusting a light level of the light source to a calibration level and wherein moving the photosensor comprises moving the photosensor until the switching device changes state.

9. A photocontrol device comprising:

a circuit board having a photosensor mounted on an upper surface thereof;

a cover having a light transmissive window therein and wherein the cover is positioned over the upper surface of the circuit board with the light transmissive window positioned adjacent the photosensor;

wherein the photosensor is mounted on the circuit board by at least one flexible mounting leg that is bent to a selected angle to misalign the photosensor and the light transmissive window to provide a desired sensitivity to light of the photocontrol device; and a detection circuit coupled to the photosensor by the at least one flexible mounting leg and wherein the detection circuit does not include a calibration resistor for the photosensor.

10. The photocontrol device of claim 9 wherein the photosensor is misaligned toward an upper surface of the cover and away from the circuit board and wherein the cover is configured to present a shadowed region to the photosensor when the photocontrol device is positioned in sunlight.

* * * * *